(12) United States Patent
Watanabe et al.

(10) Patent No.: US 12,080,740 B2
(45) Date of Patent: Sep. 3, 2024

(54) MULTI-LAYER METAL STACK FOR ACTIVE PIXEL REGION AND BLACK PIXEL REGION OF IMAGE SENSOR AND METHODS THEREOF

(71) Applicant: OMNIVISION TECHNOLOGIES, INC., Santa Clara, CA (US)

(72) Inventors: Kazufumi Watanabe, Mountain View, CA (US); Chih-Wei Hsiung, San Jose, CA (US); Chao Niu, Santa Clara, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 326 days.

(21) Appl. No.: 17/561,351

(22) Filed: Dec. 23, 2021

(65) Prior Publication Data

US 2023/0207592 A1 Jun. 29, 2023

(51) Int. Cl.
*H01L 23/00* (2006.01)
*H01L 27/146* (2006.01)

(52) U.S. Cl.
CPC .. *H01L 27/14623* (2013.01); *H01L 27/14605* (2013.01); *H01L 27/14685* (2013.01)

(58) Field of Classification Search
CPC ......... H01L 27/14623; H01L 27/14605; H01L 27/14685
See application file for complete search history.

(56) References Cited

U.S. PATENT DOCUMENTS

| | | | |
|---|---|---|---|
| 8,698,217 B2 | 4/2014 | Hsu et al. |
| 8,866,250 B2 | 10/2014 | Ting et al. |
| 9,397,129 B2 | 7/2016 | Chien et al. |
| 9,911,780 B1 | 3/2018 | Wang et al. |
| 9,985,062 B2 | 5/2018 | Jung |
| 2018/0019280 A1 | 1/2018 | Lee et al. |
| 2021/0104560 A1 | 4/2021 | Lee |
| 2021/0233945 A1 | 7/2021 | Hsu et al. |
| 2021/0265397 A1 | 8/2021 | Han et al. |

FOREIGN PATENT DOCUMENTS

TW 202131507 A1 8/2021

OTHER PUBLICATIONS

Taiwan Office Action mailed Jul. 10, 2024, issuedin related Taiwanese Application No. 111128259 filed Jul. 28, 2022, 7 pages.

*Primary Examiner* — Anthony Ho
(74) *Attorney, Agent, or Firm* — Christensen O'Connor Johnson Kindness PLLC (57) ABSTRACT

An image sensor includes an active pixel photodiode, a black pixel photodiode, a metal grid structure, and a light shield. Each of the active pixel photodiode and the black pixel photodiode are disposed in a semiconductor material having a first side and a second side opposite the first side. The first side of the semiconductor material is disposed between the light shield and the black pixel photodiode. The metal grid structure includes a first multi-layer metal stack including a first metal and a second metal different from the first metal. The light shield includes a second multi-layer stack including the first metal and the second metal. A first thickness of the first multi-layer metal stack is less than a second thickness of the second multi-layer metal stack.

20 Claims, 8 Drawing Sheets

MULTI-LAYER METAL STACK FOR ACTIVE PIXEL REGION AND BLACK PIXEL REGION OF IMAGE SENSOR AND METHODS THEREOF

TECHNICAL FIELD

This disclosure relates generally to image sensors, and in particular but not exclusively, relates CMOS image sensors and applications thereof.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as an analog output image signals on column bitlines that vary as a function of the incident image light. In other words, the amount of image charge generated is proportional to the intensity of the image light, which is read out as analog image signals from the column bitlines and converted to digital values to produce digital images (i.e., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Embodiments of an apparatus, system, and method each including or otherwise related to an image sensor with respective multi-layer metal stacks for an active pixel region and a black pixel region are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the embodiment is included in at least one embodiment of the present invention. Thus, the appearances of the phrases "in one example" or "one embodiment" in various places throughout this specification are not necessarily all referring to the same embodiment. Furthermore, the particular features, structures, or characteristics may be combined in any suitable manner in one or more embodiments.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Advancements in semiconductor processing techniques have enabled the fabrication of complementary metal oxide semiconductor devices (e.g. image sensors, processors, displays, and the like) with increasingly smaller feature sizes, which has enabled miniaturization of many devices. However, in the case of image sensors, a reduction in image pixel size may lead to a reduction in certain performance metrics. For example, as image pixels become smaller the sensitivity to light may decrease and as image pixels become physically closer to one another crosstalk (e.g., electrical, optical, or a combination thereof) between adjacent pixels may increase.

Embodiments described herein utilize, or are otherwise related to, an image sensor with respective multi-layer metal stacks for an active pixel region and a black pixel region to enhance image sensor sensitivity to light while reducing or otherwise mitigating electrical and/or optical crosstalk between adjacent pixels. In particular, a first multi-layer metal stack is utilized for forming a metal grid structure aligned with an active pixel region (e.g., for capturing an image of an external scene) and a second multi-layer metal stack is utilized for forming a light shield aligned with a black pixel region (e.g., for generating one or more black reference signals). Advantageously, the first and second multi-layer metal stacks share a common base number of metal layers to enable a reduction in fabrication processing steps while still enabling a difference in thickness between the first multi-layer metal stack and the second multi-layer metal stack. It is noted that the metal grid structure and the light shield have opposing purposes, with the metal grid structure designed to direct incident light towards active pixel photodiodes in the active pixel region while mitigating electrical and optical crosstalk between adjacent active pixel photodiodes and the light shield designed to attenuate or reduce an intensity of light incident or otherwise directed toward black pixel photodiodes in the black pixel region (e.g., attenuation value of at least −45$d$B for light incident upon the black pixel region of the image sensor). Accordingly, in the embodiments described herein, the respective thickness of the first and second multi-metal layer stacks may be tailored to achieve the desired performance of both the metal grid structure (e.g., lower in thickness and width to reduce light absorption and increase light sensitivity of the active pixel region) and the light shield (e.g., higher in thickness relative to the metal grid structure to increase light attenuation or intensity reduction).

Figure 1A:
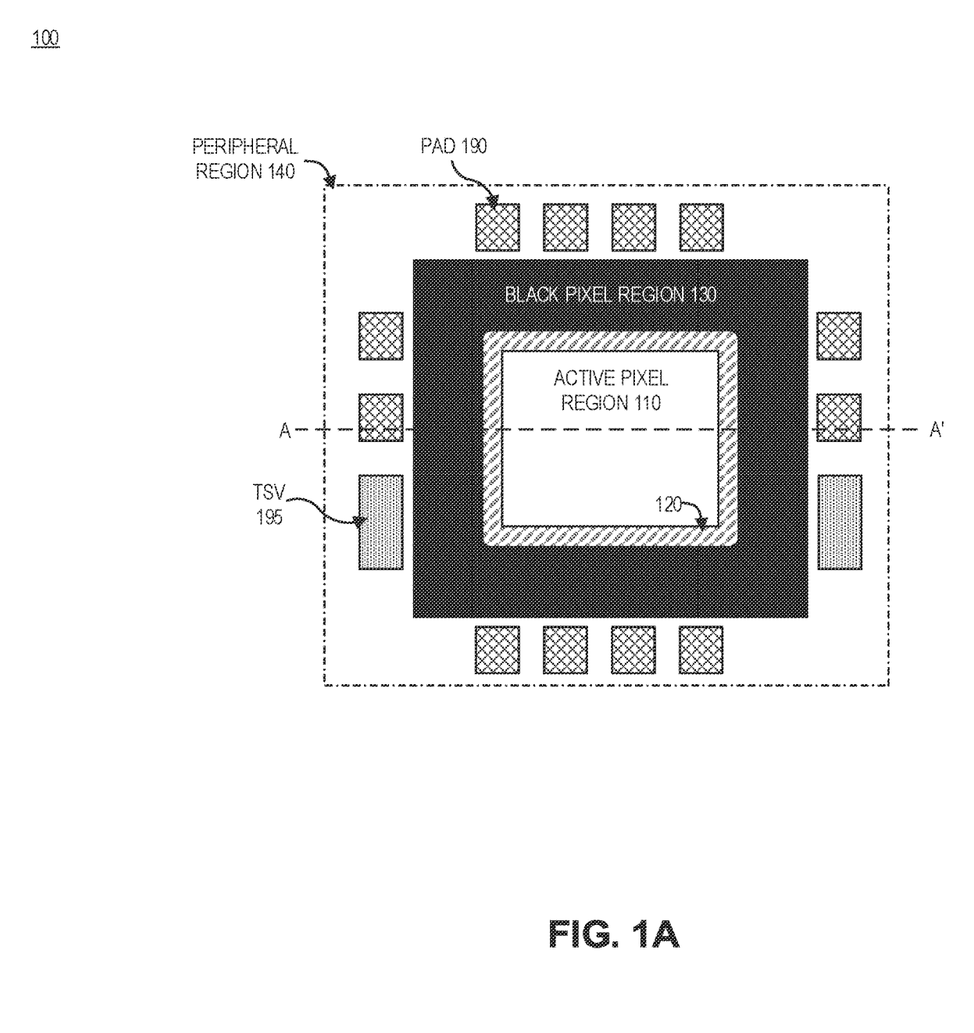
FIG. 1A illustrates a top view of an image sensor with a first multi-layer metal stack for an active pixel region and a second multi-layer metal stack for a black pixel region, in accordance with the teachings of the present disclosure.

FIG. 1A illustrates a top view of an image sensor 100 with a first multi-layer metal stack for an active pixel region 110 and a second multi-layer metal stack for a black pixel region 130, in accordance with the teachings of the present disclosure. As illustrated, the image sensor 100 includes active pixel region 110, dummy pixel region 120, black pixel region 130, peripheral region 140, a plurality of contact pads 190, and a plurality of through silicon vias (TSV) 195. In the illustrated embodiment, the dummy pixel region 120, the black pixel region 130, and the peripheral region 140 all laterally surround the active pixel region 110. The dummy pixel region 120 is disposed between the active pixel region 110 and the black pixel region 130. The black pixel region 130 is disposed between the peripheral region 140 and the dummy pixel region 120. The black pixel region 130 is also disposed between the peripheral region 140 and the active pixel region 110. The plurality of contact pads 190 and the plurality of TSVs 195 are disposed within the peripheral region 140 and collectively positioned around the black pixel region 130.

Figure 1B:
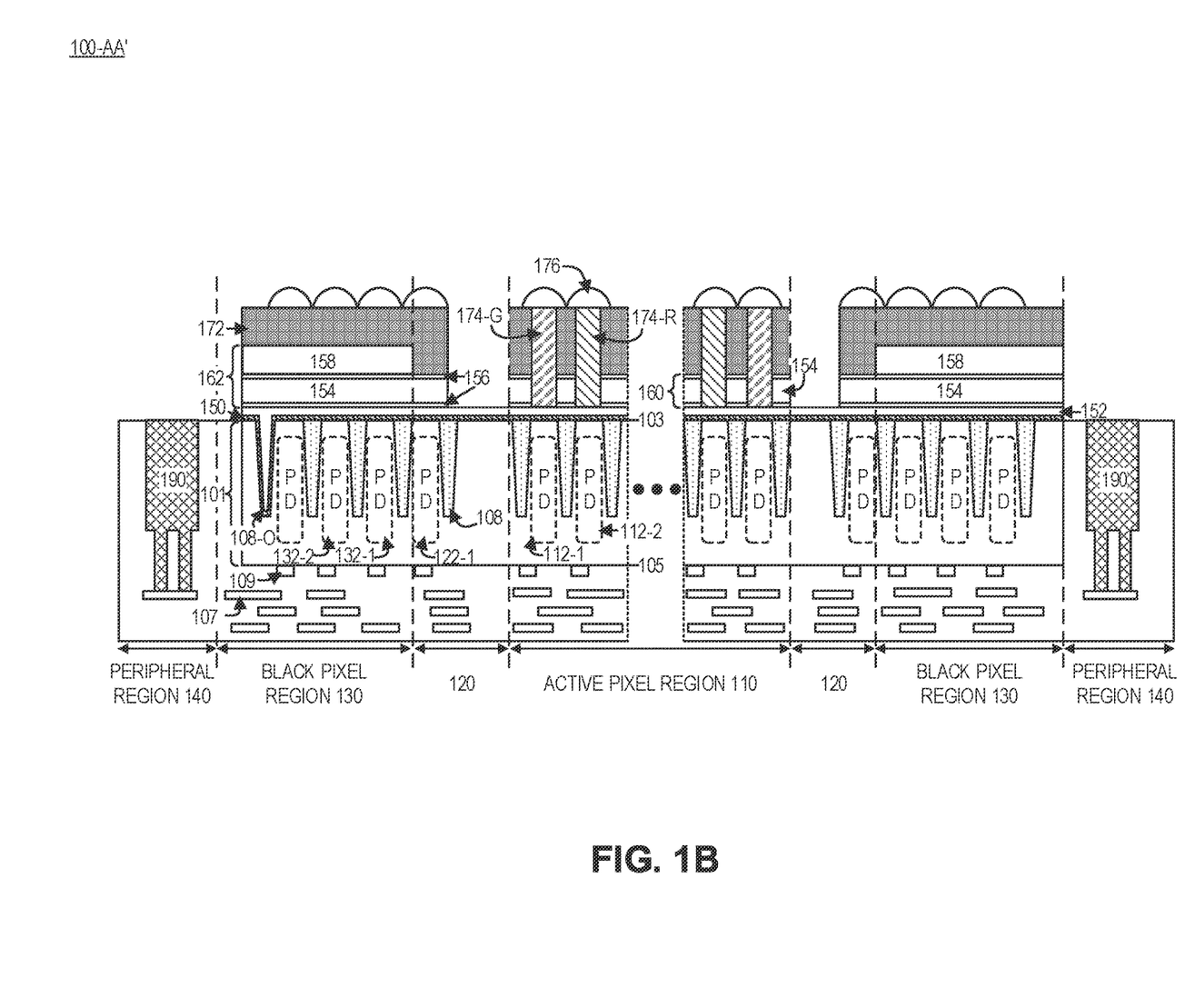
FIG. 1B illustrates a cross-sectional view of the image sensor illustrated in FIG. 1A along line A-A', in accordance with the teachings of the present disclosure.

The active pixel region 110 includes a plurality of active pixel photodiodes (see, e.g., the plurality of active pixel photodiodes 112 illustrated in FIG. 1B) to generate one or more image signals representative of an external scene. For example, in response to incident light on the image sensor, image charge may be collected by individual active pixel photodiodes included in the active pixel region 110. The image charge may then be read out as an analog signal to generate that is converted to a digital signal (e.g., an image signal for a given one or more pixels included in the active pixel region 110). The black pixel region 130 includes a plurality of black pixel photodiodes (see, e.g., the plurality of black pixel photodiodes 132 illustrated in FIG. 1B) to generate one or more black reference signals (e.g., based on a readout of one or more black pixel photodiodes included in the black pixel region 130). The one or more black reference signals may be utilized to calibrate (e.g., on an active pixel basis, active pixel row basis, active pixel column basis, a combination thereof, or otherwise) the one or more image signals generated from the active pixel region 110. It is appreciated that CMOS image sensors may include inaccurate image data due to the presence of dark current (e.g., noise that is not due to the absorption of a photon) in the active pixels themselves, which may result in an elevated baseline when generating one or more image signals from the active pixel region 110. To compensate for the dark current, the one or more black reference signals may be utilized to correct the one or more image signals (e.g., by subtracting the one or more black reference signals from the one or more image signals).

In some embodiments, a dummy pixel region 120 may be disposed between the black pixel region 130 and the active pixel region 110, as illustrated in FIG. 1A. The dummy pixel region 120 includes a plurality of dummy pixel photodiodes (see, e.g., the plurality of dummy pixel photodiodes 122 illustrated in FIG. 1B), which may correspond to non-imaging photodiodes. Specifically, the dummy pixel region 120 may be disposed between the active pixel region 110 and one or more potential sources of noise (e.g., the black pixel region 130, the plurality of contact pads 190, the plurality of TSVs 195, other circuitry or logic not illustrated that may be disposed within the peripheral region 140, or other components of the image sensor 100) to the active pixel region 110. Accordingly, in some embodiments, the dummy pixel region 120 provides physical separation between the active pixel region 110 and one or more potential sources of noise.

As illustrated in FIG. 1A, the dummy pixel region 120 and the black pixel region 130 are shaped (e.g., based on the arrangement of the plurality of black pixel photodiodes or dummy pixel photodiodes) to form respective closed loop shapes that laterally surround the active pixel region 110. However, in other embodiments the dummy pixel region 120 and the black pixel region 130 may have a corresponding shape different from a closed loop (e.g., an open loop shape, a rectangular shape, a circular shape, or otherwise). Additionally, it is appreciated that in some embodiments the dummy pixel region 120 and the black pixel region 130 may have different shapes or arrangements. For example, the black pixel region 130 may not necessarily surround the active pixel region 110. In one embodiment, the black pixel region 130 may have a rectangular shape that is aligned with a row or a column of active pixel photodiodes included in the active pixel region 110. In some embodiments, the plurality of active pixel photodiodes included in the active pixel region 110 are arranged (e.g., in rows and columns) such that the active pixel region 110 has a square or rectangular shape. However, in other embodiments, the active pixel region 110 may have a different shape (e.g., a circular shape, a hexagonal shape, or any other shape).

FIG. 1B illustrates a cross-sectional view 100-AA' of the image sensor 100 illustrated in FIG. 1A along line A-A', in accordance with the teachings of the present disclosure. In the illustrated embodiment, the image sensor 100 includes the active pixel region 110, the dummy pixel region 120, the black pixel region 130, and the peripheral region 140. The image sensor 100 further includes a semiconductor material 101 (e.g., silicon, a silicon germanium alloy, germanium, a silicon carbide alloy, an indium gallium arsenide alloy, any other alloys formed of III-V compounds, other semiconductor materials or alloys, combinations thereof, a substrate thereof, a bulk substrate thereof, or a wafer thereof) with a first side 103 (e.g., a backside) and a second side 105 (e.g., a frontside), a plurality of metal layers 107, a plurality of isolation structures 108, a plurality of transistor gates 109, a plurality of active pixel photodiodes 112 (e.g., a first active pixel photodiode 112-1 and a second active pixel photodiode 112-2), a plurality of dummy pixel photodiodes 122 (e.g., a first dummy pixel photodiode 122-1), a plurality of black pixel photodiodes 132 (e.g., a first black pixel photodiode 132-1 and a second black pixel photodiode 132-2), an anti-reflective layer 150, a buffer oxide layer 152, a first metal layer 154, second metal layers 156, a third metal layer 158, a buffer layer 172 (e.g., oxide-based material layer), a plurality of color filters 174 (e.g., a green color filter 174-G, a red color filter 174-R, or any other color filter), a plurality of microlenses 176, and a plurality of contact pads 190.

Within the active pixel region 110, the first metal layer 154 and the second metal layers 156 form a first multi-layer metal stack 160. Within the black pixel region 130, the first metal layer 154, the second metal layers 156, and the third metal layer 158 form a second multi-layer metal stack 162 aligned with the plurality of black pixel photodiodes 132 (e.g., the first side 103 of the semiconductor substrate 101 is disposed between the second multi-layer metal stack 162 and the plurality of black pixel photodiodes 132) such that the second multi-layer metal stack 162 may block or otherwise attenuate light incident upon the black pixel region 130 (e.g., to block light from reaching the plurality of black pixel photodiodes 132).

In one or more embodiments, the first side 103 may be referred as an illuminated surface or side of the semiconductor material 101 and the second side 105 may be referred as a non-illuminated surface or side of the semiconductor material 101. In the illustrated embodiment, the anti-reflective layer 150 is disposed between the first side 103 of the semiconductor material 101 and the buffer oxide layer 152. In some embodiments, the anti-reflective layer 150 may include tantalum oxide (e.g., $Ta_2O_5$), hafnium oxide (e.g., $HfO_2$), aluminum oxide (e.g., $Al_2O_3$), zirconium oxide (e.g., $Zr_2O_3$), or combinations thereof. In one or more embodiments, the anti-reflective layer 150 is at least 50 nm thick. In the same or other embodiments, the anti-reflective layer 150 is between 50 nm thick and 100 nm thick. The buffer oxide layer 152 is disposed between the anti-reflective layer 150 and the second metal layers 156. In some embodiments, the buffer oxide layer 152 includes a dielectric oxide (e.g., $SiO_2$) and is at least 100 nm thick. In some embodiments, the buffer oxide layer 152 has at a thickness between 100 nm to 130 nm. In one or more embodiments, the buffer oxide layer 152 provides a planarized surface for subsequent processes such as the formation of the first multi-layer metal stack 160, the second multi-layer metal stack 162, and/or the plurality of color filters 174. Additionally, the buffer oxide layer 152 may also provide protection to underlying layers (e.g., the anti-reflective layer 150, the semiconductor material 101, and any other components or materials disposed between the buffer oxide layer 152 and the second side 105 of the semiconductor material 101). It is appreciated that the thickness of the buffer oxide layer 152 may be configured or otherwise tailored based on the specific configuration of the image sensor 100 and/or processing requirements. (e.g., based on manufacturing node or fabrication requirements, thickness of previous or subsequent components, or the like). In one embodiment, the buffer oxide layer 152 has a thickness sufficient to buffer mechanical stress induced by a chemical mechanical polishing (CMP) process utilized for planarization (e.g., the buffer oxide layer 152 may buffer mechanical stress induced by the CMP process and mitigate or otherwise prevent the mechanical stress from damaging the anti-reflective layer 150, the semiconductor material 101, or other components under the buffer oxide layer 152). The buffer oxide layer 152 further separates the first multi-layer metal stack 160 and the second multi-layer metal stack 162 from the semiconductor material 101.

In some embodiments, the semiconductor material 101 may further include one or more layers disposed underneath the buffer oxide layer 152 (e.g., between the buffer oxide layer 152 and the first side 103 of the semiconductor substrate 101). In one embodiment, a surface passivation layer may be disposed between the anti-reflective layer 152 and the first side 103 of the semiconductor material 101. The surface passivation layer may be formed of high-κ material (e.g., a material having a dielectric constant greater than the dielectric constant of silicon oxide) that provides a fixed negative charge (e.g., hafnium oxide, aluminum oxide, or other passivating oxide) to provide surface passivation of the first side 103 of the semiconductor material.

In the illustrated embodiment of FIG. 1B, the plurality of isolation structures 108 (e.g., deep trench isolation structures formed of at least an oxide material) are arranged to electrically and optically isolate individual photodiodes (e.g., individual ones of the plurality of active pixel photodiodes 112, the plurality of dummy pixel photodiodes 122, and/or the plurality of black pixel photodiodes 132) from one another. As illustrated, the individual isolation structures included in the plurality of isolation structures 108 may extend from the first side 103 of the semiconductor material 101 towards the second side 105. In some embodiments, the plurality of isolation structures 108 may be formed by filling trenches formed in the semiconductor material 101 with one or more dielectric materials (e.g., an oxide material, a low-n material, a different dielectric material, or combinations thereof). In some embodiments, the plurality of isolation structures 108 may be formed by filling trenches with the one or more dielectric materials in combination with (e.g., sequentially or simultaneously) a metal material. The trenches may be formed before forming the anti-reflective layer 150, the buffer oxide layer 152, and any intermediary layers between the anti-reflective layer 150 and the buffer oxide layer 152. In an optional or alternative embodiment, the trenches may be formed before the formation of the anti-reflective layer 150, the buffer oxide layer 152, and any intermediary layers between anti-reflective layer 150 and the buffer oxide layer 152 such that the isolation structure itself (see, e.g., isolation structure 108-O) is formed from the anti-reflective layer 150, the buffer oxide layer 152, and any intermediary layers between the anti-reflective layer 150 and the buffer oxide layer 152, which results in the anti-reflective layer 150, the buffer oxide layer 152, and any intermediary layers to extend into the trenches and collectively and continuously line sidewalls of the trenches. It is appreciated that in some embodiments at least one of the plurality of isolation structures 108 and/or all of the plurality of isolation structures 108 in the active pixel region 110, the dummy pixel region 120, and/or the black pixel region 130 may have a structure similar to that of the isolation structure 108-0. It is further appreciated that in some embodiments the intermediary layers (e.g., the surface passivation layer disposed between the anti-reflective layer 150 and the buffer oxide layer 152) may also line or otherwise be included in the plurality of isolation structures 108 to induce a hole accumulation region to surround the buffer oxide layer 152 disposed within the trench (e.g., the portion of the buffer oxide layer 152 that forms or is otherwise included in the plurality of isolation structures 108) to passivate surface defects and trench sidewall defects that may occur during fabrication (e.g., reduce or otherwise mitigate material induced stress or etching damage).

The first metal layer 154 is disposed between the second metal layers 156. In one embodiment, the first metal layer 154 includes a first metal corresponding to tungsten or aluminum that is greater than 20 nm thick (e.g., 30 nm, 40 nm, 50 nm). In the same or other embodiments, the first metal layer 154 is greater in thickness than at least one individual layer included in the second metal layers 156. In some embodiments, at least one of the second metal layers 156 has a thickness of less than 30 nm (e.g., 25 nm, 20 nm, 15 nm) and includes a second metal corresponding to titanium nitride or titanium. As illustrated, the second metal layers 156 are disposed between the first side 103 of the semiconductor material 101 and the buffer layer 172. In one embodiment, the third metal layer 158 is at least 50 nm or greater in thickness and includes a third metal corresponding to tungsten or aluminum. In some embodiments, the third metal layer 158 has a thickness substantially similar to (e.g., within 10% difference) as the first metal layer 154. In some embodiments, the third metal layer 158 is greater in thickness than the first metal layer 154. In some embodiments, the buffer layer 172 is disposed between the plurality of microlenses 176 and the first metal layer 154. In one embodiment, the buffer layer 172 is a transparent dielectric layer and includes an oxide-based material (e.g., $SiO_2$) or a low-n material with a refractive index less than a corresponding refractive index of the semiconductor material 101, the plurality of color filters 174, and/or the plurality of microlenses 176. In some embodiments, at least a portion of the buffer layer 172 has a thickness greater than 100 nm (e.g., 110 nm, 125 nm, 150 nm).

Figure 2A:
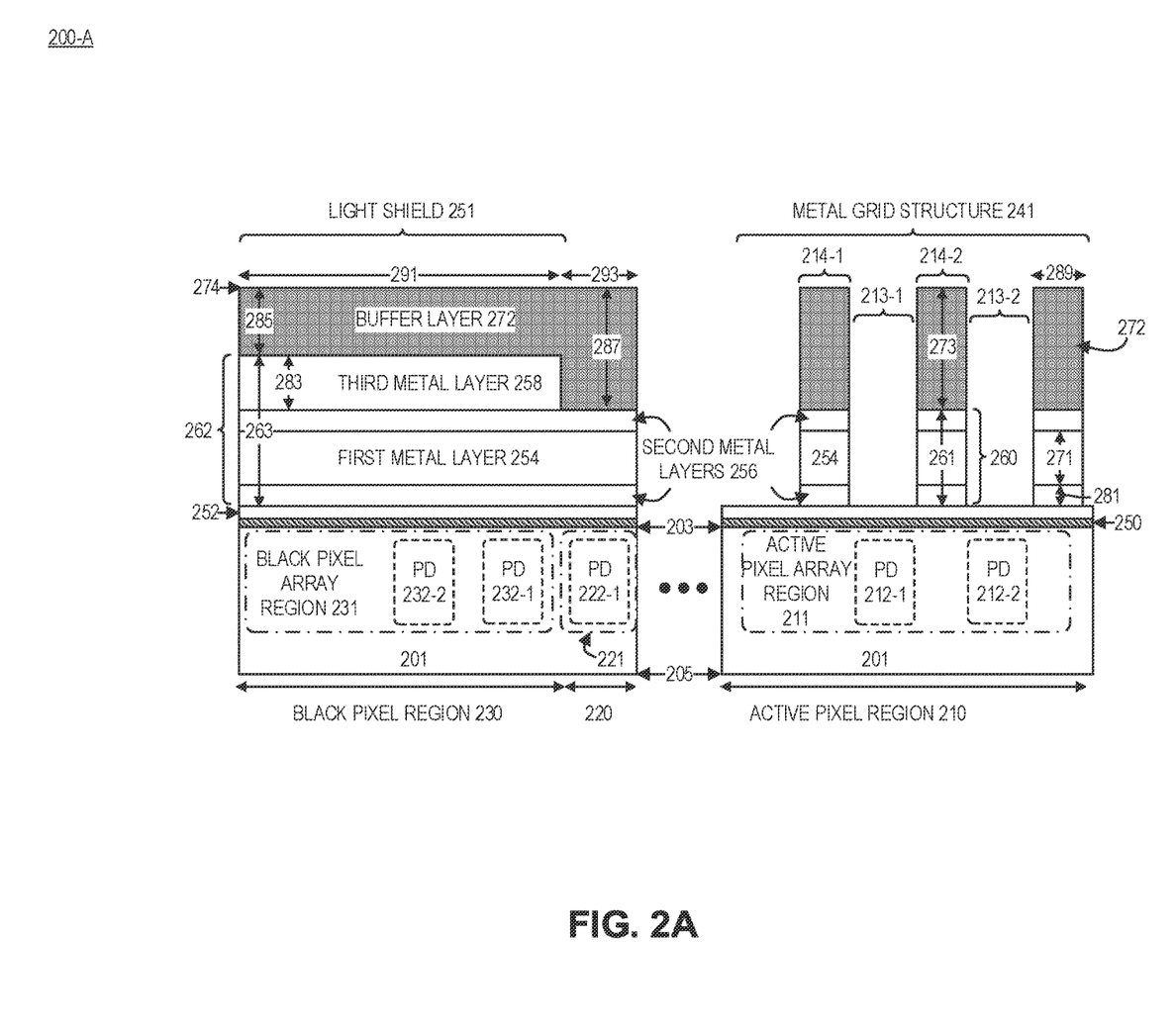
FIGS. 2A and 2B illustrate example multi-layer metal stacks for formation of a metal grid structure and a light shield, in accordance with the teachings of the present disclosure.

FIG. 2A illustrates example multi-layer metal stacks 260 and 262 for formation of a metal grid structure 241 and a light shield 251 of an image sensor 200-A, in accordance with the teachings of the present disclosure. Image sensor 200-A, the components included in image sensor 200-A, and the corresponding arrangement of components illustrated in FIG. 2A may be implemented in the image sensor 100 illustrated in FIG. 1A and FIG. 1B. Accordingly, it is appreciated that like-labeled features may share similar or identical attributes (e.g., composition, relative arrangement with other components, shape, function, or the like). For example, image sensor 200-A includes semiconductor material 201, which may be the same or similar to the semiconductor material 101 illustrated in FIG. 1A and FIG. 1B, in accordance with the teachings of the present disclosure. Additionally, it is appreciated that certain components may be omitted in FIG. 2A (e.g., color filters, microlenses, isolation structures, contact pads, or the like) for clarity.

Referring back to FIG. 2A, image sensor 200-A includes semiconductor material 201 including a first side 203 and a second side 205, a plurality of active pixel photodiodes 212 (e.g., active pixel photodiode 212-1 disposed in the semiconductor material 201 between the first side 203 and the second side 205) included in an active pixel array region 211, a plurality of dummy pixel photodiodes 222 (e.g., dummy pixel photodiode 222-1) included in a dummy pixel array region 221 disposed in the semiconductor material 201 between the first side 203 and the second side 205), a plurality of black pixel photodiodes 232 (e.g., black pixel photodiode 232-1 disposed in the semiconductor material 201 between the first side 203 and the second side 205) included in a black pixel array region 231, an anti-reflective layer 250, a buffer oxide layer 252, a first metal layer 254, second metal layers 256, a third metal layer 258 and a buffer layer 272. Within the active pixel region 210, the first metal layer 254 and the second metal layers 256 form a first multi-layer metal stack 260. Within the black pixel region 230, the first metal layer 254, the second metal layers 256, and the third metal layer 258 form a second multi-layer metal stack 262 aligned with the plurality of black pixel photodiodes 232 (e.g., the first side 203 of the semiconductor substrate 201 is disposed between the second multi-layer metal stack 262 and the plurality of black pixel photodiodes 232) such that the second multi-layer metal stack 262 may block or otherwise attenuate light incident upon the black pixel region 230 (e.g., to block light from reaching the plurality of black pixel photodiodes 132).

The first side 203 may be referred as an illuminated side of the image sensor 200-A and the second side 205 may be referred as a non-illuminated side of the image sensor 200-A.

As illustrated, the active pixel array region 211 includes the plurality of active pixel photodiodes 212 (e.g., active pixel photodiode 212-1 and active pixel photodiode 212-2), which may be arranged as an array of rows and columns to form, at least in part, active pixel region 210 of the image sensor 200-A. The dummy pixel array region 221 includes the plurality of dummy pixel photodiodes (e.g., dummy pixel 222-1), which are non-imaging photodiodes and form, at least in part, a dummy pixel region 220 of the image sensor 200-A. The black pixel array region 231 includes the plurality of black pixel photodiodes 232 (e.g., black pixel photodiode 232-1 and black pixel photodiode 232-2), which may be arranged in an array of rows and columns to form, at least in part, black pixel region 230 of the image sensor 200-A.

The metal grid structure 241 is positioned within the active pixel region 210 of the image sensor 200-A and, more specifically, is disposed proximate to the first side 203 of the semiconductor material 201. The metal grid structure 241 includes a plurality of pillars 214 (e.g., pillar 214-1, pillar 214-2, and pillar 214-3) arranged to form a plurality of apertures 213 (e.g., aperture 213-1 and aperture 213-2), each aperture optically aligned with an underlying active pixel photodiode (e.g., active pixel photodiodes 212-1, 212-2 and the like) included in the active pixel array region 211. For example, pillar 214-1 and pillar 214-2 are physically separated from one another to form, at least in part, aperture 213-1, which is optically aligned the underlying active pixel photodiode 212-1 such that incident light parallel to the plane of the page will propagate through the aperture 213-1 and be incident upon the active pixel photodiode 212-1, and incident light directed to active pixel photodiode 212-1 but oblique to the pillar 214-1 and pillar 214-2 will be blocked by pillar 214-1 and pillar 214-2 by absorption and/or reflection before reaching adjacent active pixel photodiode 212-1. In other words, the plurality of pillars 214 of the metal grid structure 241 are structured and arranged to form light guides (e.g., corresponding to the plurality of apertures 213) that direct incident light by reflection and/or refraction towards a respective underlying active pixel photodiode included in the plurality of active pixel photodiodes 212. In some embodiments, each of a plurality of color filters (e.g., color filters 174-G, 174-R) is disposed in corresponding apertures 213-1 and 213-2 included in the plurality of apertures 213 and on the buffer oxide layer 252 aligned with underlying active pixel photodiodes. In some embodiments, the plurality of apertures 213 may be physically centered over a corresponding one of the plurality of active pixel photodiodes 212. It is appreciated that the embodiment of the illustrated image sensor 200-A does not include color filters that fill the regions between the plurality of pillars 214 (e.g., corresponding to the plurality of apertures 213) as illustrated in FIG. 1B, which have been omitted for the sake of clarity. However, in some embodiments the regions between the plurality of pillars 214 may be filled with color filters with different photoresponses (e.g., red, green, blue, yellow, cyan, magenta, yellow, black, infrared, or other color filters).

In the illustrated embodiment, each of the plurality of pillars 214 of the metal grid structure 241 include the first multi-layer metal stack 260 and the buffer layer 272. The first multi-layer metal stack 260 includes the first metal layer 254 and the second metal layers 256. As illustrated, the first metal layer 254 is sandwiched (e.g., disposed) between the second metal layers 256, where one of the second metal layers 256 is between the first metal layer 254 and the buffer layer 272, and another one of the second metal layer 256s is between the first metal layer 254 and buffer oxide layer 252. In some embodiments, the individual one of the second metal layers 256 between the first metal layer 254 and buffer oxide layer 252 may serve as a diffusion barrier to prevent metal diffusion from the first metal layer 254 into the semiconductor material 201. In the same or other embodiments, the second metal layers 256 may further function as an adhesive layer to increase adhesion between the first metal layer 254 and buffer oxide layer 252 and/or increase adhesion between the first metal layer 254 and buffer layer 272. In some embodiments, the first metal layer 254 may be formed of a first metal (e.g., tungsten or aluminum) and the second metal layers 256 may be formed of a second metal (e.g., titanium nitride or titanium) that is different than the first metal. In other words, the metal grid structure 241 includes the first multi-layer metal stack 260 including the first metal and the second metal. In the same or other embodiments, the second metal included in the second metal layers 256 may be a metal-alloy composed of at least a metal material and a non-metal material (e.g., titanium nitride).

The light shield 251 is positioned within the black pixel region 230 of the image sensor 200-A and, more specifically, is disposed proximate to the first side 203 of the semiconductor material 201. In some embodiments, the light shield 251 covers the black pixel region 230. The light shield 251 includes the second multi-layer metal stack 262 and the buffer layer 272. As illustrated in FIG. 2A, the light shield is optically aligned with the plurality of black pixel photodiodes 232 included in the black pixel array region 231 such that the first side 203 of the semiconductor material 201 is disposed between the light shield 251 and the plurality of black pixel photodiodes 232 (e.g., the black pixel photodiode 232-1). The second multi-layer metal stack 262 includes the first metal layer 254, the second metal layers 256, and the third metal layer 258. As illustrated, the first metal layer 254 is sandwiched between the second metal layers 256. The first metal layer 254 is also disposed between the third metal layer 258 and the plurality of black pixel photodiodes 232. It is appreciated that one of the second metal layers 256 is disposed between the first metal layer 254 and the third metal layer 258, and that another one of the second metal layers 256 is disposed between the first metal layer 254 and buffer oxide layer 252. In the same or other embodiments, individual ones of the second metal layers 256 may function as an adhesive layer to increase adhesion between the first metal layer 254 and buffer oxide layer 252 and/or increase adhesion between the first metal layer 254 and the third metal layer 258. As discussed previously, the first metal layer 254 may include the first metal (e.g., tungsten or aluminum) and the second metal layers 256 may include the second metal (e.g., titanium nitride or titanium).

It is appreciated that the first multi-layer metal stack 260 of the metal grid structure 241 and the second multi-layer metal stack 262 of the light shield 251 both include the first metal layer 254 and the second metal layers 256. This is because in the illustrated embodiment, the first multi-layer metal stack 260 and the second multi-layer metal stack 262 share common processing steps, but represent positional differences (i.e., first regions of the first metal layer 254 and the second metal layers 256 located in the active pixel region 210 are utilized to form the metal grid structure 241 and second regions of the first metal layer 254 and the second metal layers 256 located in the black pixel region 230 are utilized to form the light shield 251). Accordingly, as indicated by the shared name and reference labels, the composition and thickness of the first metal layer 254 and the second metal layers 256 are substantially equal throughout the image sensor 200-A (e.g., the regions of the first metal layer 254 for both the metal grid structure 241 and the light shield 251 have the same composition and approximate thickness). However, it is appreciated that there may be minor (e.g., within 10%) differences in thickness of the second metal layers 256 over the active pixel region 210 than the second metal layers 256 over the black pixel region 230 due to manufacturing differences (see, e.g., FIG. 3C in which the distal second metal layer included in the second metal layers 356 over the active pixel region may be slightly etched relative to the distal second metal layer included in the second metal layers 356 over the black pixel region).

One difference between the first multi-layer metal stack 260 of the metal grid structure 241 and the second multi-layer metal stack 262 of the light shield 251 is that the second multi-layer metal stack 262 includes the third metal layer 258, which is not included in the first multi-layer metal stack 260. In some embodiments, the third metal layer 258 may include the first metal that is also included in the first metal layer 254. In one embodiment, the third metal layer 258 has a composition equivalent to a corresponding composition of the first metal layer 254. In other embodiments, the third metal of the third metal layer 258 may be different from the first metal included in the first metal layer 254 and the second metal included in the second metal layers 256. In the same or other embodiments, the first metal may be tungsten and the third metal may be aluminum (or vice versa).

Another difference between the first multi-layer metal stack 260 and the second multi-layer metal stack 262 is the total number of metal layers. In some embodiments, the first multi-layer metal stack 260 includes N metal layers, where N corresponds to any integer greater than or equal to 2. In the same embodiment, the second multi-layer metal stack 262 includes at least N+1 metal layers. In other words, in some embodiments, the second multi-layer metal stack 262 has one or more metal layers than the first multi-layer metal stack 260. This difference in number of layers (and thus thickness) enables a first thickness 261 of the first multi-layer metal stack 260 to be less than a second thickness 263 of the second multi-layer metal stack 262. Consequently, the metal grid structure 241 and the light shield 251 may be independently tuned to enhance their respective functions. For example, the first multi-layer metal stack 260 can be made less thick to enhance sensitivity of the underlying active pixel photodiodes included in the plurality of active pixel photodiodes 212 and the second multi-layer metal stack 262 can be made thicker to improve attenuation of incident light provided by the light shield 251. Another difference between the first multi-layer metal stack 260 and the second multi-layer metal stack 262 is structure. As described above, the first multi-layer metal stack 260 is structured to form the plurality of apertures 213 and the first multi-layer metal stack 260 does not continuously extend over the active pixel region 210 (e.g., the first multi-layer metal stack 260 forms the plurality of pillars 214 rather than continuously extending throughout the active pixel array region 211) while the second multi-layer metal stack 262 continuously extends throughout the black pixel array region 231. It is appreciated that when the term "multi-layer metal stack" and "N metal layers" are referring to metal layers disposed proximate to the first side 203 of the semiconductor substrate and are utilized in the formation of the metal grid structure 241 and the light shield 251. To be clear, the terms, "multi-layer metal stack," "N metal layer", and the associated individual metal layers are distinct and separate from the components formed during the metallization process in which routing layers, metal interconnects, contacts, and the like, which are formed proximate to the second side 205 of the semiconductor material 201 (see, e.g., FIG. 1B showing the plurality of metal layers 107 which is distinctly separate from the first multi-layer metal stack 160 and the second multi-layer metal stack 162).

The image sensor 200-A further includes the dummy pixel array region 221 including the plurality of dummy pixel photodiodes 222 (e.g., dummy pixel photodiode 222-1). As illustrated, the plurality of dummy pixel photodiodes 222 are laterally disposed between the plurality of active pixel photodiodes 212 and the plurality of black pixel photodiodes 232 (e.g., the dummy pixel photodiode 222-1 is disposed within the semiconductor material 201 between the active pixel photodiode 212-1 and the black pixel photodiode 232-1). The image sensor 200-A also includes the buffer layer 272. In some embodiments, the buffer layer 272 is a transparent dielectric layer includes at least one of an oxide-based material, a metal oxide, or a low-n material. The low-n material is defined as any material having a refractive index less than a corresponding refractive index of the color filter material forming the plurality of color filters (not illustrated in FIG. 2A, but shown in FIG. 1A) and/or the semiconductor material 201 for a visible frequency range (e.g., for one or more wavelengths between 380 nm and 750 nm). As illustrated the buffer layer 272 has a varying thickness to compensate for a thickness difference between the first multi-layer metal stack 260 of the metal grid structure 241 and the second multi-layer metal stack 262 of the light shield 251. The first multi-layer metal stack 260 and the second multi-layer metal stack 262 are each disposed between the buffer layer 272 and the first side 203 of the semiconductor material 201. The varying thickness allows for a distal end 274 of the buffer layer 272 to be parallel with the first side 203 of the semiconductor material 201 for subsequent processing (e.g., color filter array formation, microlens array formation, formation of peripheral elements such as through silicon vias, contact pad, or component or element). For the active pixel region 210, the buffer layer 272 includes a first portion 289 (e.g., the portion of the buffer layer 272 for any one of the plurality of pillars 214). The first multi-layer metal stack 260 is disposed between the first portion 289 of the buffer layer 272 and the first side 203 of the semiconductor material 201.

For the black pixel region 230, the buffer layer 272 includes a second portion 291 (e.g., the portion of the buffer layer 272 within the black pixel region 230). The second multi-layer metal stack 262 is disposed between the second portion 291 of the buffer layer 272 and the plurality of black pixel photodiodes 232 (e.g., the black pixel photodiode 232-1). As illustrated, a first buffer layer thickness 273 of the first portion 289 of the buffer layer 272 is greater than a second buffer layer thickness 285 of the second portion 291 of the buffer layer 272.

For the dummy pixel region 220, the buffer layer 272 includes a third portion 293 (e.g., the portion of the buffer layer 272 within the dummy pixel array region 220). The third portion 293 of the buffer layer 272 is aligned with the plurality of dummy photodiodes 222 (e.g., dummy photodiode 222-1) such that the first side 203 of the semiconductor material 201 is disposed between the third portion 293 of the buffer layer 272 and the plurality of dummy photodiodes 222 (e.g., dummy photodiode 222-1). As illustrated, a third buffer layer thickness 287 of the third portion 293 of the buffer layer 272 is equal to the first buffer layer thickness 273 of the first portion 289 of the buffer layer 272.

In some embodiments, a first metal layer thickness 271 of the first metal layer 254 is greater than a second metal layer thickness 281 of any one of the second metal layers 256. In some embodiments, the first metal layer thickness 271 is at least 10 nm thick (e.g., 10 nm, 20 nm, 30 nm, 50 nm, etc.). In the same or other embodiments, the second metal layer thickness 281 is greater than 0 and 30 nm or less (e.g., 25 nm, 20 nm, 10 nm, etc.). In some embodiments, the first metal layer thickness 271 is configured based on a required or targeted quantum efficiency of the plurality of active pixel photodiodes 212 in the active pixel region 210. In some embodiments, a combined thickness (e.g., the first thickness 261 of the first multi-layer metal stack 260) of the first metal layer 254 and the second metal layers 256 is between 30 nm and 80 nm. In the same or other embodiments, the first thickness 261 may be less than or equal to 100 nm. In one embodiment, a third metal layer thickness 283 of the third metal layer 258 is at least 50 nm (e.g., 50 nm, 80 nm, 100 nm, etc.). In some embodiments, a combined thickness of the first metal layer 254, the second metal layers 256, and the third metal layer 258 (e.g., the second thickness 263 of the second multi-layer metal stack 262) is at least 100 nm (e.g., 100 nm, 150 nm, 200 nm, etc.). In one embodiment, the third metal layer thickness 283 is greater than or equal to the first metal layer thickness 271. In some embodiments, the first metal layer thickness 271 and/or the third metal layer thickness 283 is at least three times great than the second metal layer thickness 281. In some embodiments, the third metal layer thickness 283 is configured based on required or targeted light suppression level or attenuation level for light that may be incident upon the black pixel region 230. In one embodiment, the first metal of the first metal layer 254 and/or the third metal of the third metal layer 258 is tungsten, the second metal of the second metal layers 256 is titanium nitride. In such an embodiment, the first metal layer thickness 271 and/or the third metal layer thickness 283 may be at least five times greater than the second metal layer thickness 281. In some embodiments, the individual pillars of the plurality of pillars 214 are greater than 150 nm thick (e.g., 150 nm, 175 nm, 200 nm, 250 nm, 300 nm, 325 nm, 350 nm, 400 nm, etc.). In the same or other embodiments, a pillar width (e.g., orthogonal to the first thickness 261) of the individual pillars included in the plurality of pillars 214 is greater than 0 but less than or equal to 80 nm (e.g., 80 nm, 60 nm, 40 nm, etc.).

Figure 2B:
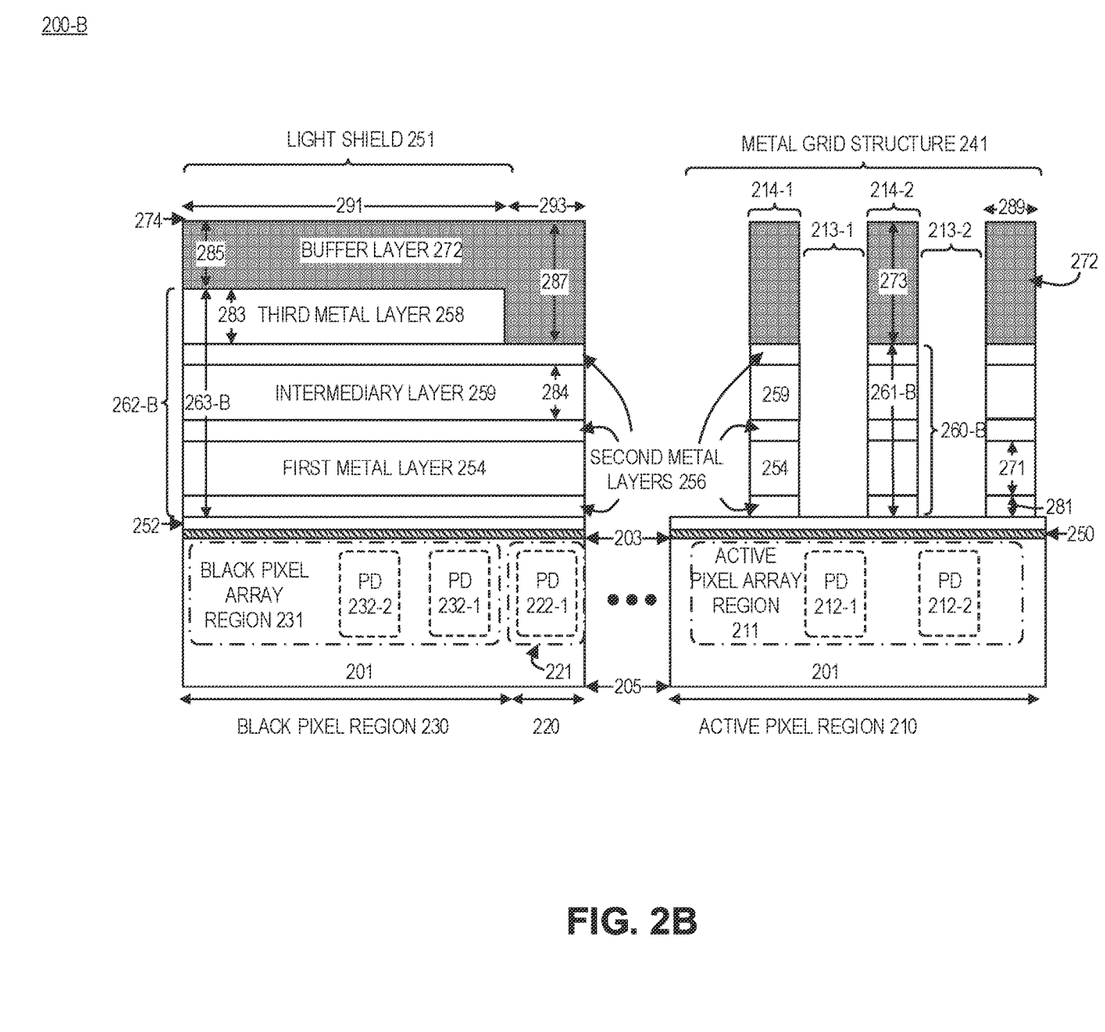

FIG. 2B illustrates example multi-layer metal stacks 260-B and 262-B for formation of a metal grid structure 241 and a light shield 251 of an image sensor 200-B, in accordance with the teachings of the present disclosure. Image sensor 200-B, the components included in image sensor 200-B, and the corresponding arrangement of components illustrated in FIG. 2B may be implemented in the image sensor 100 illustrated in FIG. 1A and FIG. 1B. Accordingly, it is appreciated that like-labeled features may share similar or identical attributes (e.g., composition, relative arrangement with other components, shape, function, or the like). For example, image sensor 200-B includes semiconductor material 201, which may be the same or similar to the semiconductor material 101 illustrated in FIG. 1A and FIG. 1B, in accordance with the teachings of the present disclosure. Additionally, it is appreciated that certain components may be omitted in FIG. 2B (e.g., color filters, microlenses, isolation structures, or the like) for clarity.

It is further appreciated that image sensor 200-B of FIG. 2B is similar in many regards to image sensor 200-A in FIG. 2A. Indeed, many of the like-labeled features of FIG. 2B may be identical to the corresponding feature in FIG. 2A, including, but not limited to, composition, geometric structure, arrangement, and the like. Referring back to FIG. 2B, one difference is the total number of metal layers within first-multi-layer metal stack 260-B and second multi-layer metal stack 262-B. For example, one additional second metal layer is included in the second metal layers 256 (e.g., the individual second metal layer disposed between the first metal layer 254 and intermediary layer 259 or the individual second metal layer disposed between the intermediary layer 259 and the third metal layer 258) and intermediary layer 259 is also included. In other words, an adjacent pair of metal layers (i.e. one second metal layer included in the second metal layers 256 and one intermediary layer 259) has been included in both the first multi-layer metal stack 260-B and the second multi-layer metal stack 262-B relative to the corresponding multi-layer metal stacks (e.g., 260 and 262) illustrated in FIG. 2A. In this manner, it is appreciated that the thickness (e.g., a first thickness 261-B of the first multi-layer metal stack 260-B and a second thickness 263-B of the second multi-layer metal stack 262-B) may be tuned by including one or more instances of the adjacent pair of metal layers such that there are N metal layers included in the first multi-layer metal stack 260-B and N+1 metal layers included in the second multi-layer metal stack 262-B. It is appreciated that an intermediary thickness 284 of the intermediary layer 259 does not necessarily need to be the same other layers included in the first multi-layer metal stack 260-A and/or the second multi-layer metal stack 262-B. Similarly, individual layers of the second metal layers 256 do not necessarily need to have the same thickness. It is appreciated that in some embodiments, the first metal layer thickness 271 of the first metal layer 254, the intermediary thickness 284 of the intermediary layer 259, the thickness of each individual layer included in the second metal layers 256, and the third metal layer thickness 283 of the third metal layer 258 can each be tuned independently to achieve a targeted thickness for the first thickness 261-B of the first multi-layer metal stack 260-B and/or the second thickness 263-B of the second multi-layer metal stack 262-B.

FIGS. 3A-3J illustrate a process illustrated in sequential order for fabricating an image sensor with respective multi-layer metal stacks for an active pixel region and a black pixel region, in accordance with the teachings of the present disclosure. It is appreciated that the left and right sides (separated by an ellipses) respectively include a black pixel region and an active pixel region of the image sensor being fabricated. The process illustrated by FIGS. 3A-3J may be one possible implementation for fabricating the image sensor 100 illustrated in FIGS. 1A-1B, the image sensor 200-A illustrated in FIG. 2A, and the image sensor 200-B illustrated in FIG. 2B. Accordingly, it is appreciated that like-labeled features may share similar or identical attributes (e.g., composition, relative arrangement with other components, shape, function, or the like). For example, the process illustrated in FIGS. 3A-3J includes semiconductor material 301, which may be the same or similar to the semiconductor material 201 illustrated in FIGS. 2A-2B, and the semiconductor material 101 illustrated in FIGS. 1A-1B, in accordance with the teachings of the present disclosure. Additionally, it is appreciated that certain components may be omitted in FIG. 3 (e.g., color filter, microlenses, anti-reflective layer, dummy pixel photodiodes, or the like) for clarity and/or brevity. The process illustrated in FIGS. 3A-3J include, in one or more of the aforementioned figures, semiconductor material 301 having a first side 303 and a second side 305 opposite the first side, an active pixel array region 311 (e.g., including a plurality of active pixel photodiodes), a black pixel array region 331 (e.g., including a plurality of black pixel photodiodes), a buffer oxide layer 350, a first metal layer 354, second metal layers 356, a third metal layer 358, first photoresist 337, first multi-layer metal stack 360, second multi-layer metal stack 362, buffer layer 372, second photoresist with a first pattern 339-1, second photoresist with a second pattern 339-2, metal grid structure 341, and light shield 351.

Figure 3A:
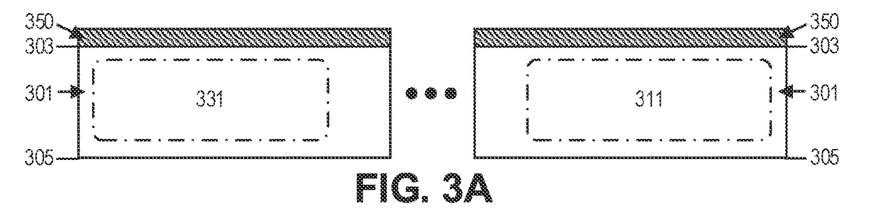
FIGS. 3A-3J illustrate a process for fabricating an image sensor with respective multi-layer metal stacks for an active pixel region and a black pixel region, in accordance with the teachings of the present disclosure.

FIG. 3A illustrates providing the semiconductor material 301 having the first side 303 (or illuminated side) and the second side 305 opposite the first side 303. The semiconductor material 301 includes an active pixel photodiode (e.g., included in the active pixel array region 311) and a black pixel photodiode (e.g., included in the black pixel array region 331), each disposed in the semiconductor material 301, for example by ion implantation. Each of active pixel photodiode and black pixel photodiode may be a pinned photodiode, unpinned photodiode, or a partially pinned photodiode. The semiconductor material 301 may further have an oxide-based dielectric material deposited on the first side 303, followed by a planarizing process to form the buffer oxide layer 350 having a planarized top surface. Although not illustrated, in some embodiments and prior to the formation of buffer oxide layer 350, a plurality of isolation trenches may be formed in the semiconductor material 301 surrounding each individual active pixel photodiode included in the active pixel array region 311 and each individual black pixel photodiode included in the black pixel array region 331. An anti-reflective layer and any intermediary layers between the anti-reflective layer and the buffer oxide layer 350 may be deposited on the first side 303 of the semiconductor material 301 and into the plurality of isolation trenches to line or otherwise coat the bottom surface and sidewalls of the plurality of isolation trenches (e.g., by chemical vapor deposition). In the same or other embodiments, the plurality of isolation trenches may then be filled with one or more dielectric materials (e.g., an oxide-based material, low-n material, other dielectric materials, or combinations thereof) to form the plurality of isolation structures (e.g., isolation structure 108 and/or isolation structure 108-O illustrated in FIG. 1B) to electrically and/or optically isolate individual photodiodes (e.g., individual active pixel photodiodes, individual black pixel photodiodes, and/or individual dummy photodiodes) from one another. In one embodiment, the deposition of an oxide-based dielectric material for forming the buffer oxide layer 350 may include depositing one or more oxide-based dielectric materials into the plurality of isolation trenches to form the plurality of isolation structures.

Figure 3B:
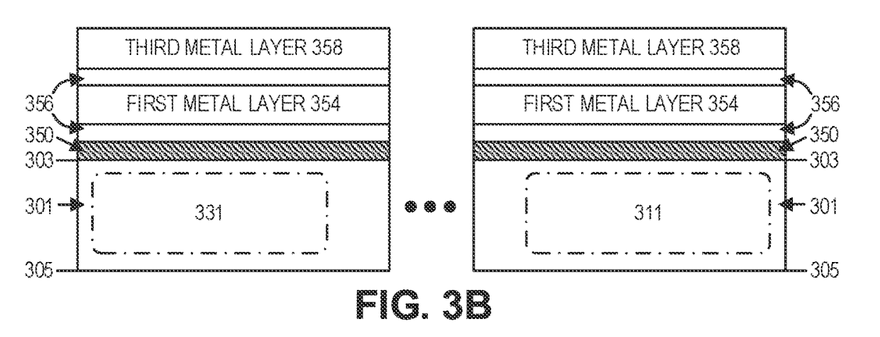

FIG. 3B is subsequent to FIG. 3A and shows depositing layers of metal on the semiconductor material 301 proximate to the first side 303 on the buffer oxide layer 350 to form the first metal layer 354, the second metal layers 356 sandwiching the first metal layer 354, and the third metal layer 358. In some embodiments, the first metal layer 354, the second metal layers 356, and the third metal layer 358 respectively include a first metal (e.g., tungsten or aluminum), a second metal (e.g., titanium nitride or titanium), and a third metal (e.g., tungsten or aluminum). As illustrated in FIG. 3B, the first metal layer 354 is disposed between the third metal layer 358 and the first side 303 of the semiconductor material 301.

Figure 3C:
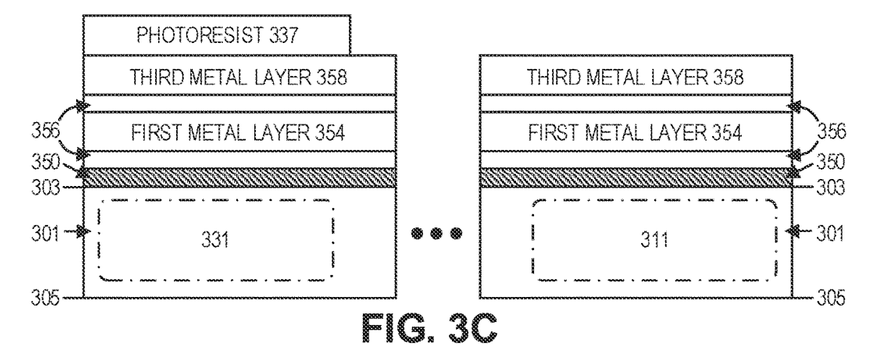

FIG. 3C may follow FIG. 3B and illustrates depositing the photoresist 337 to selectively cover a portion of the metal layers (e.g., the first metal layer 354, the second metal layers 356, and the third metal layer 358) disposed proximate to or otherwise aligned with the black pixel array region 331. Specifically, the photoresist 337 is patterned to prevent the underlying metal layers from being etched in a subsequent step. In some embodiments, the process for forming an intermediate layer with additional second metal layers 356 sandwiched between one of the intermediate layers and the first metal layer 354 may be performed between FIG. 3B and FIG. 3C for forming first multi-layer metal stack and second multi-layer metal stack of FIG. 2B, where deposition thickness of the first metal layer, the intermediate layer, the third metal layer, and each second metal layer can be individually tuned.

Figure 3D:
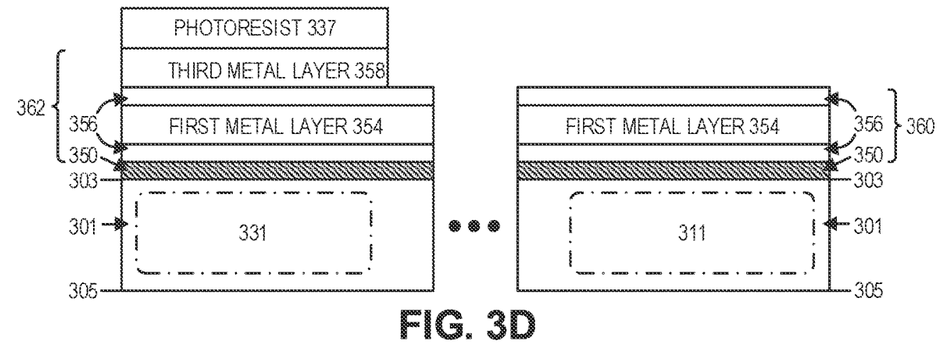

FIG. 3D is subsequent to FIG. 3C and shows etching an active pixel portion of the layers of metal to selectively remove the third metal layer 358 disposed proximate to the active pixel photodiode (i.e., the active pixel array region 311) to form the first multi-layer metal stack 360. An unetched portion of the layers of metal corresponds to the second multi-layer metal stack 362. Advantageously, the distal one of the second metal layers 356 from the first side 303 of the semiconductor material 301 in the active pixel region acts as an etch stop to prevent the deposited metal layers that are not protected by the photoresist 337 from being completely etched away (e.g., the first metal layer 354 and the second metal layers 356 proximate to the active pixel array region 311 remain after etching). This is achieved, at least in part, by selecting an etching process that etches the third metal layer 358 (e.g., the third metal) at a different rate than the second metal layers 356 (e.g., the second metal) in order to use the second metal layers 356 as an etch stop. Accordingly, the second metal layers 356 function as both an adhesion promotor (e.g., to promote adhesion between the third metal layer 358 and the first metal layer 354 and/or promote adhesion between the first metal layer 354 and the buffer oxide layer 350) and an etch stop layer (e.g., to protect the first metal layer 354 from being etched during the etching process illustrated in FIG. 3D).

Figure 3E:
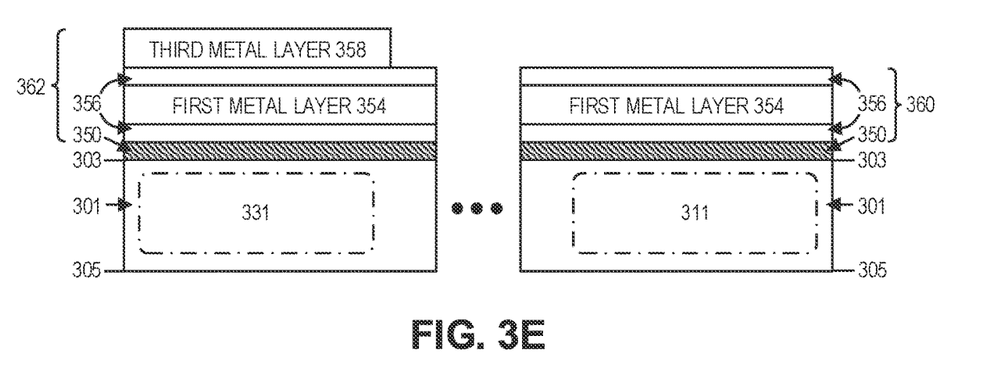

FIG. 3E is after FIG. 3D and illustrates removing the photoresist 337 from on top of the third metal layer 358 proximate to the black pixel array region 331. The photoresist 337 may be removed via a chemical wash (e.g., one or more solvents capable of dissolving the patterned or cross-linked photoresist 337)

Figure 3F:
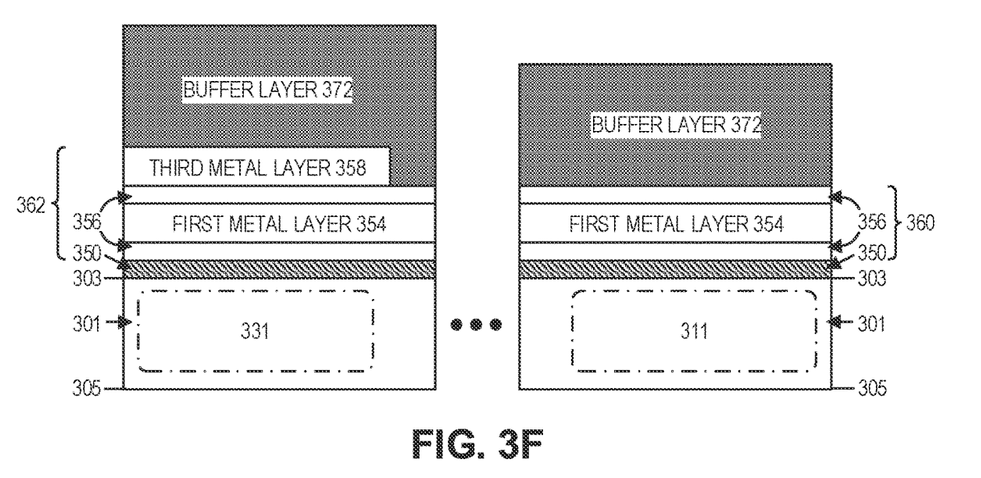

FIG. 3F is subsequent to FIG. 3E and shows depositing the buffer layer 372 over at least the active pixel portion of the layers of metal and the unetched portion of the layers of metal that respectively correspond to the first multi-layer metal stack 360 and the second multi-layer metal stack 362. The first multi-layer metal stack 360 and the second multi-layer metal stack 362 are disposed between the buffer layer 372 and the first side 303 of the semiconductor material 301.

Figure 3G:
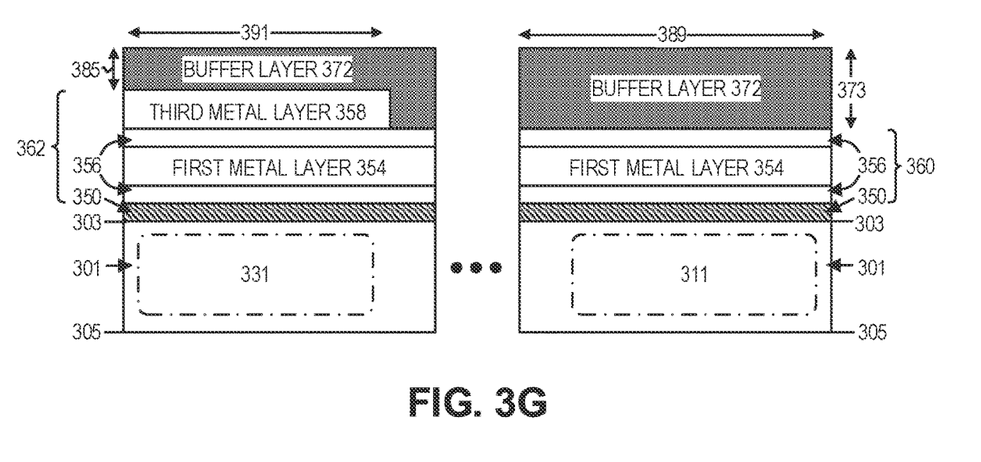

FIG. 3G is after FIG. 3F and shows planarizing the buffer layer 372 such that a first portion 389 of the buffer layer 372 has a first buffer layer thickness 373 greater than a second buffer layer thickness 385 of a second portion 391 of the buffer layer 372. In the illustrated embodiment, the first multi-layer metal stack 360 is disposed between the first portion 389 of the buffer layer 372 and the first side 303 of the semiconductor material 301. The second multi-layer metal stack 362 is disposed between the second portion 391 of the buffer layer 372 and the black pixel photodiode (e.g., the black pixel array region 331).

Figure 3H:
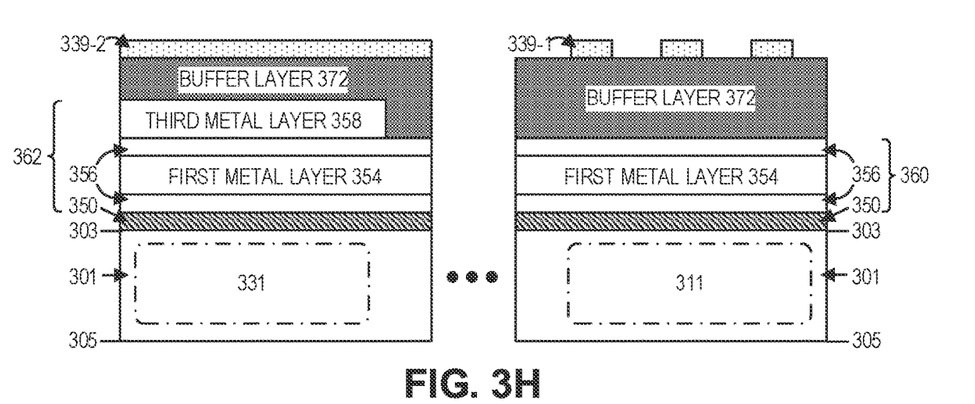

FIG. 3H is subsequent to FIG. 3G and illustrates depositing the second photoresist with the first pattern 339-1 and the second pattern 339-2. The first pattern 339-1 of the photoresist is to form the plurality of pillars 314 (see, e.g., FIG. 3I) of the metal grid structure 341 (see, e.g., FIG. 3J). Specifically, the first pattern 339-1 of the second photoresist protects portions of the underlying buffer layer 372 and the first multi-layer metal stack 360. The second pattern 339-2 of the second photoresist is structured to protect the buffer layer 372 proximate to the black pixel array region 331 (and the dummy pixel array region adjacent to the black pixel array region which is not illustrated but can be seen in FIG. 1B, FIG. 2A, and FIG. 2B).

Figure 3I:
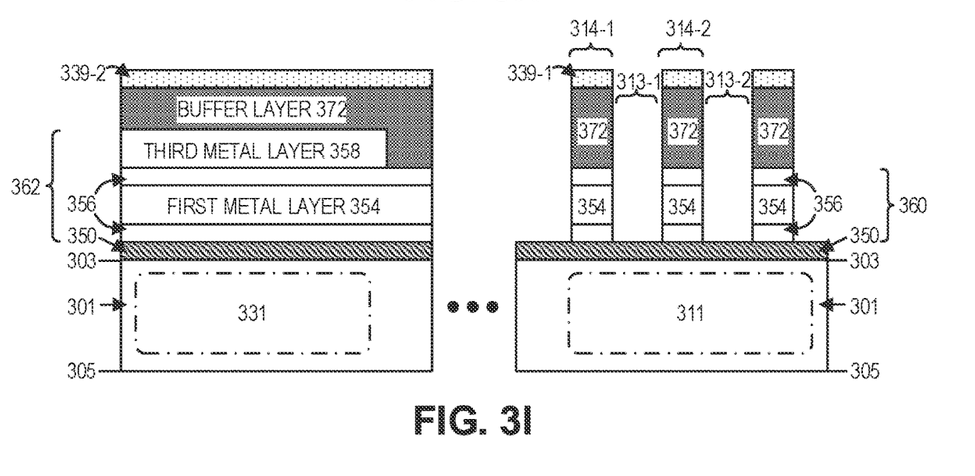

FIG. 3I is after FIG. 3H and shows selectively etching the buffer layer 372 and the first multi-layer metal stack 360 to form a plurality of apertures 313 (e.g., aperture 313-1 and aperture 313-2) aligned with active pixel photodiodes that define, at least in part, the metal grid structure 341. In some embodiments, the portion of the buffer layer 372 associated with the plurality of pillars 314 functions as a light guide, which has been self-aligned via the second photoresist with the first pattern 339-1. The light guides may help mitigate electrical and optical crosstalk between adjacent active pixel photodiodes included in the active pixel array region 311.

Figure 3J:
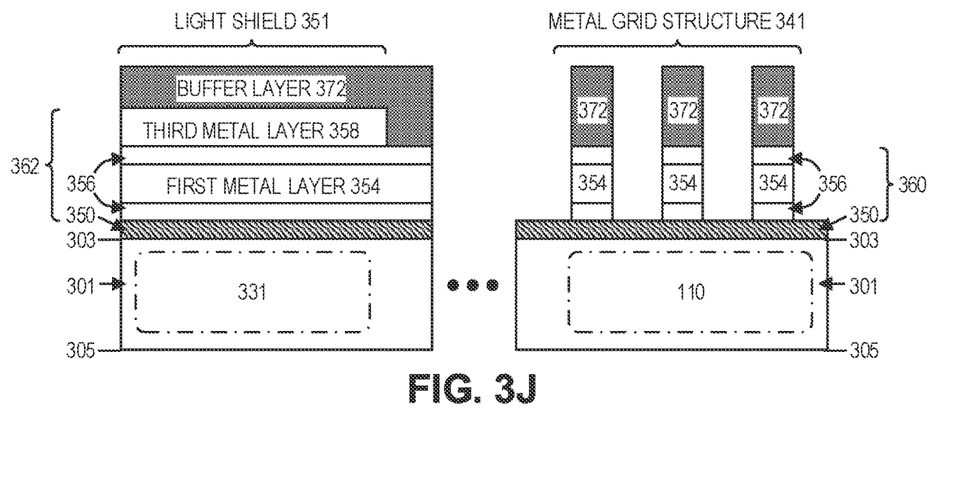

FIG. 3J is subsequent to FIG. 3I and illustrates removing the second photoresist with the first pattern 339-1 and the second pattern 339-2 to form the metal grid structure 341 and the light shield 351. In some embodiments there may be additional steps after the removal of the second photoresist (e.g., the first pattern 339-1 and the second pattern 339-2) such as selectively backfilling the plurality of apertures 313 with color filters to form a color filter pattern (e.g., RGB, RGGB, RCCB, RGB-IR, Quad Bayer, CYMK, or any other color filter pattern), forming of a plurality of microlenses, or other process steps.

It is appreciated that the various process steps illustrated by FIGS. 3A-3J may be accomplished or otherwise performed with existing CMOS manufacturing techniques such as, but not limited to photolithography techniques (e.g., to define or otherwise pattern first photoresist 337, second photoresist with a first pattern 339-1, and second photoresist 339-2), metal deposition techniques (e.g., atomic layer deposition, physical vapor deposition, thermal evaporation, magnetron sputtering, or the like to deposit the first metal layer 354, the second metal layers 356, the third metal layer 358, the buffer oxide layer 350, the buffer layer 372, or the like), etching techniques (e.g., dry etching techniques such as plasma etching, wet etching techniques such as chemical etching, or otherwise to etch various components such as the first metal layer 354, the second metal layers 356, the third metal layer 358, the buffer oxide layer 350, the buffer layer 372, or the like), and planarization techniques (e.g., chemical-mechanical polishing or planarization to planarize the buffer layer 272).

Figure 4:
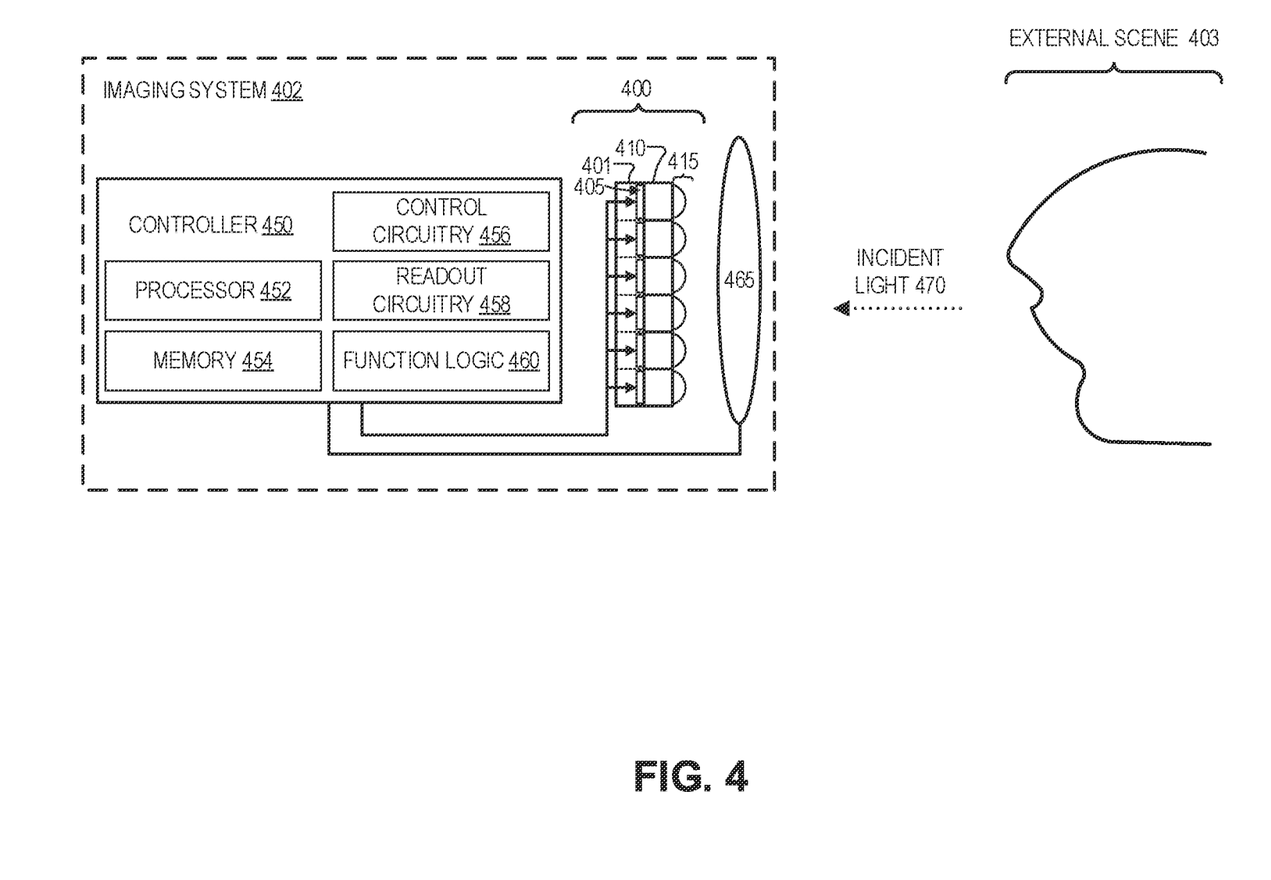
FIG. 4 is a functional block diagram of an imaging system including an image sensor with multi-layer metal stacks, in accordance with the teachings of the present disclosure.

FIG. 4 is a functional block diagram of an imaging system 402 including an image sensor 400 with multi-layer metal stacks, in accordance with the teachings of the present disclosure. The image sensor 400 may have a structure corresponding to image sensor 100 illustrated in FIGS. 1A-1B, image sensor 200-A illustrated in FIG. 2A, and/or image sensor 200-B illustrated in FIG. 2B. The image sensor 400 may be fabricated by the process illustrated in FIGS. 3A-3J. The imaging system 402 includes image sensor 400 to generate electrical or image signals in response to incident light 470, objective lens(es) 465 with adjustable optical power to focus on one or more points of interest within the external scene 403, and controller 450 to control, inter alia, operation of image sensor 400 and objective lens(es) 465. Image sensor 400 is one possible implementation of image sensor 100 illustrated in FIGS. 1A-1B, image sensor 200-A illustrated in FIG. 2A, and/or image sensor 200-B illustrated in FIG. 2B. Image sensor 400 is a simplified schematic showing a semiconductor material 401 with a plurality of photodiodes 405 disposed within respective portions of the semiconductor material 401, a plurality of color filters 410, and a plurality of microlenses 415. The controller 450 includes one or more processors 452, memory 454, control circuitry 456, readout circuitry 458, and function logic 460.

The controller 450 includes logic and/or circuitry to control the operation (e.g., during pre-, post-, and in situ phases of image and/or video acquisition) of the various components of imaging system 402. The controller 450 may be implemented as hardware logic (e.g., application specific integrated circuits, field programmable gate arrays, system-on-chip, etc.), software/firmware logic executed on a general purpose microcontroller or microprocessor, or a combination of both hardware and software/firmware logic. In one embodiment, the controller 450 includes the processor 452 coupled to memory 454 that stores instructions for execution by the controller 450 and/or one or more other components of the imaging system 402. The instructions, when executed, may cause the imaging system 402 to perform operations associated with the various functional modules, logic blocks, or circuitry of the imaging system 402 including any one of, or a combination of, the control circuitry 456, the readout circuitry 458, the function logic 460, image sensor 400, objective lens 465, and any other element of imaging system 402 (illustrated or otherwise). The memory is a non-transitory computer-readable medium that may include, without limitation, a volatile (e.g., RAM) or non-volatile (e.g., ROM) storage system readable by controller 450. It is further appreciated that the controller 450 may be a monolithic integrated circuit, one or more discrete interconnected electrical components, or a combination thereof. Additionally, in some embodiments one or more electrical components may be coupled together to collectively function as controller 450 for orchestrating operation of the imaging system 402.

Control circuitry 456 may control operational characteristics of the photodiode array 405 (e.g., exposure duration, when to capture digital images or videos, and the like). Readout circuitry 458 reads or otherwise samples the analog signal from the individual photodiodes (e.g., read out electrical signals generated by each of the plurality of photodiodes 405 in response to incident light to generate image signals for capturing an image frame, and the like) and may include amplification circuitry, analog-to-digital (ADC) circuitry, image buffers, or otherwise. In the illustrated embodiment, readout circuitry 458 is included in controller 450, but in other embodiments readout circuitry 458 may be separate from the controller 450. Function logic 460 is coupled to the readout circuitry 458 to receive image data to demosaic the image data and generate one or more image frames. In some embodiments, the electrical signals and/or image data may be manipulated or otherwise processed by the function logic 460 (e.g., apply post image effects such as crop, rotate, remove red eye, adjust brightness, adjust contrast, or otherwise).

The processes explained above may be implemented using software and/or hardware. The techniques described may constitute machine-executable instructions embodied within a tangible or non-transitory machine (e.g., computer) readable storage medium, that when executed by a machine (e.g., controller 450 of FIG. 4) will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
an active pixel photodiode and a black pixel photodiode, each disposed in a semiconductor material, wherein the semiconductor material includes a first side and a second side opposite the first side;
a metal grid structure disposed proximate to the first side of the semiconductor material, the metal grid structure including an aperture optically aligned with the active pixel photodiode, wherein the metal grid structure includes a first multi-layer metal stack including a first metal and a second metal different from the first metal;
a light shield optically aligned with the black pixel photodiode such that the first side of the semiconductor material is disposed between the light shield and the black pixel photodiode, wherein the light shield includes a second multi-layer metal stack including the first metal and the second metal, and
wherein a first thickness of the first multi-layer metal stack is less than a second thickness of the second multi-layer metal stack.

2. The image sensor of claim 1, wherein the first multi-layer metal stack includes N metal layers, where N corresponds to any integer greater than or equal to 2, and wherein the second multi-layer metal stack includes at least N+1 metal layers.

3. The image sensor of claim 1, further comprising a buffer layer with a varying thickness to compensate for a thickness difference between the first multi-layer metal stack of the metal grid structure and the second multi-layer metal stack of the light shield, wherein the first multi-layer metal stack and the second multi-layer metal stack are each disposed between the buffer layer and the first side of the semiconductor material, and wherein a distal end of the buffer layer is parallel with the first side of the semiconductor material.

4. The image sensor of claim 3, wherein the buffer layer includes at least one of a metal-oxide material or a low-n material, wherein a refractive index of the low-n material is less than a corresponding refractive index of the semiconductor material for a visible frequency range.

5. The image sensor of claim 3, wherein the buffer layer includes a first portion and a second portion, wherein the first multi-layer metal stack is disposed between the first portion of the buffer layer and the first side of the semiconductor material, wherein the second multi-layer metal stack is disposed between the second portion of the buffer layer and the black pixel photodiode, and wherein a first buffer layer thickness of the first portion of the buffer layer is greater than a second buffer layer thickness of the second portion of the buffer layer.

6. The image sensor of claim 5, further comprising a dummy photodiode disposed in the semiconductor material between the active pixel photodiode and the black pixel photodiode, and wherein the buffer layer includes a third portion aligned with the dummy photodiode such that the first side of the semiconductor material is disposed between the third portion of the buffer layer and the dummy photodiode, and wherein a third buffer layer thickness of the third portion of the buffer layer is equal to the first buffer layer thickness.

7. The image sensor of claim 1, wherein the first multi-layer metal stack and the second multi-layer metal stack each includes a first metal layer including the first metal, and wherein the first metal layer is sandwiched between second metal layers including the second metal.

8. The image sensor of claim 7, wherein the second metal is a metal-alloy composed of at least a metal material and a non-metal material.

9. The image sensor of claim 7, wherein the second multi-layer metal stack further includes a third metal layer including a third metal, and wherein the first metal layer is disposed between the third metal layer and the black pixel photodiode.

10. The image sensor of claim 9, wherein each of the first metal and the third metal is tungsten or aluminum, wherein the second metal is titanium nitride or titanium, and wherein a combined thickness of the first metal layer and the third metal layer is at least three times greater than a thickness of any one of the second metal layers.

11. The image sensor of claim 10, wherein the first metal is different than the third metal.

12. The image sensor of claim 7, wherein the second multi-layer metal stack further includes a third metal layer having a composition equivalent to a corresponding composition of the first metal layer, and wherein the first metal layer is disposed between the third metal layer and the black pixel photodiode.

13. The image sensor of claim 1, further comprising:
an active pixel region including an active pixel photodiode array for capturing an image of an external scene, wherein the active pixel photodiode array includes the active pixel photodiode; and
a black pixel region laterally surrounding the active pixel region, wherein the black pixel region includes a plurality of black pixel photodiodes for generating one or more black reference signals, wherein the plurality of black pixel photodiodes includes the black pixel photodiode.

14. A method for manufacturing an image sensor, the method comprising:
forming a metal grid structure disposed proximate to a first side of a semiconductor material, the metal grid structure including an aperture optically aligned with an active pixel photodiode, wherein the semiconductor material includes the first side and a second side opposite the first side, wherein the image sensor includes the active pixel photodiode and a black pixel photodiode, each disposed in the semiconductor material, wherein the metal grid structure includes a first multi-layer metal stack including a first metal a second metal different from the first metal; and
forming a light shield optically aligned with the black pixel photodiode such that the first side of the semiconductor material is disposed between the light shield and the black pixel photodiode, wherein the light shield includes a second multi-layer metal stack including the first metal and the second metal, and
wherein a first thickness of the first multi-layer metal stack is less than a second thickness of the second multi-layer metal stack.

15. The method of claim 14, wherein the forming the metal grid structure and the light shield further includes:
depositing layers of metal to form a first metal layer, second metal layers sandwiching the first metal layer, and a third metal layer, wherein the first metal layer, the second metal layers, and the third metal layer respectively include the first metal, the second metal, and a third metal, and wherein the first metal layer is disposed between the third metal layer and the first side of the semiconductor material; and
etching an active pixel portion of the layers of metal to selectively remove the third metal layer disposed proximate to the active pixel photodiode to form the first multi-layer metal stack, and wherein an unetched portion of the layers of metal corresponds to the second multi-layer metal stack.

16. The method of claim 15, wherein the first multi-layer metal stack includes N metal layers, where N corresponds to any integer greater than or equal to 2, wherein the second multi-layer metal stack includes at least N+1 metal layers.

17. The method of claim 15, further comprising:
depositing a buffer layer over at least the active pixel portion of the layers of metal and the unetched portion of the layers of metal that respectively correspond to the first multi-layer metal stack and the second multi-layer metal stack, wherein the first multi-layer metal stack and the second multi-layer metal stack are disposed between the buffer layer and the first side of the semiconductor material;

planarizing the buffer layer such that a first portion of the buffer layer has a first buffer layer thickness greater than a second buffer layer thickness of a second portion of the buffer layer, wherein the first multi-layer metal stack is disposed between the first portion of the buffer layer and the first side of the semiconductor material, and wherein the second multi-layer metal stack is disposed between the second portion of the buffer layer and the black pixel photodiode.

18. The method of claim 15, wherein a combined thickness of the first metal layer and the third metal layer is at least three times greater than a thickness of any one of the second metal layers.

19. The method of claim 15, wherein the first metal is different than the third metal.

20. The method of claim 15, wherein the third metal layer has a composition equivalent to a corresponding composition of the first metal layer.

* * * * *